United States Patent [19]
Korleski

[11] Patent Number: 5,753,358
[45] Date of Patent: May 19, 1998

[54] ADHISIVE-FILLER POLYMER FILM COMPOSITE

[75] Inventor: Joseph E. Korleski, Newark, Del.

[73] Assignee: W. L. Gore & Associates, Inc., Newark, Del.

[21] Appl. No.: 591,043

[22] Filed: Jan. 25, 1996

Related U.S. Application Data

[63] Continuation-in-part of Ser. No. 398,329, Mar. 3, 1995, abandoned, which is a continuation-in-part of Ser. No. 295,952, Aug. 25, 1994, abandoned.

[51] Int. Cl.[6] .................. B32B 5/16; B32B 5/18; B32B 27/04; B32B 27/20
[52] U.S. Cl. .................. 428/308.4; 428/304.4; 428/315.5; 428/315.9; 428/317.1; 428/317.7; 428/317.9; 428/318.4; 428/319.3; 428/319.7; 428/319.9; 428/323; 428/328; 428/331; 428/413; 428/422; 428/463; 428/521
[58] Field of Search .................. 428/317.1, 317.7, 428/317.9, 323, 327, 328, 331, 421, 422, 457, 306.6, 304.4, 308.4, 318.4, 315.5, 315.9, 319.3, 319.7, 319.9, 413, 463, 521

[56] References Cited

U.S. PATENT DOCUMENTS

| | | | |
|---|---|---|---|
| 3,407,249 | 10/1968 | Landi | 264/49 |
| 3,929,721 | 12/1975 | Leverett | 260/42.15 |
| 3,963,850 | 6/1976 | Doss et al. | 428/286 |
| 4,038,244 | 7/1977 | Ogden et al. | 260/42.16 |
| 4,143,110 | 3/1979 | Morozumi et al. | 264/117 |
| 4,169,184 | 9/1979 | Pufahl | 428/311 |
| 4,187,390 | 2/1980 | Gore | 174/102 R |
| 4,231,916 | 11/1980 | Knappenberger et al. | 260/37 EP |
| 4,241,132 | 12/1980 | Pratt et al. | 428/285 |
| 4,293,519 | 10/1981 | Knappenberger et al. | 264/272.13 |
| 4,437,865 | 3/1984 | Parekh et al. | 51/298 |
| 4,440,879 | 4/1984 | Kawachi et al. | 523/200 |
| 4,482,516 | 11/1984 | Bowman et al. | 264/127 |
| 4,661,301 | 4/1987 | Okada et al. | 264/41 |
| 4,680,220 | 7/1987 | Johnson | 428/241 |
| 4,747,897 | 5/1988 | Johnson | 156/148 |
| 4,772,509 | 9/1988 | Komada et al. | 428/251 |
| 4,784,901 | 11/1988 | Hatakeyama et al. | 428/473.5 |
| 4,798,762 | 1/1989 | Okada et al. | 428/285 |
| 4,803,115 | 2/1989 | Fushiki et al. | 428/285 |
| 4,892,669 | 1/1990 | Marcora et al. | 252/30 |
| 5,034,801 | 7/1991 | Fischer | 357/72 |
| 5,055,342 | 10/1991 | Markovich et al. | 428/137 |
| 5,087,641 | 2/1992 | Sato | 521/53 |
| 5,126,192 | 6/1992 | Chellis et al. | 428/323 |
| 5,141,972 | 8/1992 | Sato | 523/218 |

FOREIGN PATENT DOCUMENTS

| | | |
|---|---|---|
| 1213950 | 11/1986 | Canada . |
| 61-40328 | 2/1986 | Japan . |
| 62-100539 | 5/1987 | Japan . |
| 2195269 | 4/1988 | United Kingdom . |
| 9320562 | 10/1993 | WIPO . |

OTHER PUBLICATIONS

"Using GORE-TEX Reduces Signal Delay in PC Board;" Electronics; Jun. 2, 1986; McGraw-Hill, Inc.

*Primary Examiner*—Vivian Chen
*Attorney, Agent, or Firm*—Victor M. Genco, Jr.

[57] ABSTRACT

An adhesive composite material comprises an expanded fluoropolymer with nodes and interconnected fibrils, the fluoropolymer having a void volume which is at least partially filled with a mixture containing a thermoset or thermoplastic adhesive and a particulate inorganic filler. The composite material contains sufficient adhesive and filler such that the composite contains between about 5 to about 40 volume percent expanded fluoropolymer; 5–85 volume percent inorganic filler; and 10–95 volume percent of adhesive and filler, the adhesive and filler being contained within the voids of the expanded fluoropolymer. In the composite, the ratio of the mean flow pore size of the expanded fluoropolymer to the largest particle size of the filler is at least about 2 and/or the ratio of the minimum pore size of the expanded fluoropolymer to the largest particle size of the filler is at least about 1.4.

19 Claims, 4 Drawing Sheets

1

ADHISIVE-FILLER POLYMER FILM COMPOSITE

This application is a continuation-in-part of application Ser. No. 08/398,329, filed Mar. 3, 1995, abandoned, which is a continuation-in-part of application Ser. No. 08/295,952, filed Aug. 25, 1994, abandoned.

BACKGROUND OF THE INVENTION

1. Field of the Invention

The present invention relates to thin film composites formed from polymeric substrates that are imbibed with a filler-adhesive mixture. The imbibed filler provides the film composite with thermal and/or mechanical and/or electrical properties. Specifically, the present invention provides thin fluoropolymer film composites where the voids of the fluoropolymer contain a filler-adhesive mixture. The imbibed-film composites of the present invention are suitable for use in the fabrication of electronic devices.

2. Description of Related Art

Polymeric films containing fillers are suitable for use in the electronics industry in the manufacture of electronic substrates, chip packages, circuit boards and other electronic devices or in the separating technologies where filters, separators or membranes are required. The ultimate use of the film and the particular property that the film will exhibit determines the selection of the specific filler. For example, activated carbon can be incorporated into the film to provide a filter or separator. Electrical properties can be attributed to a polymer film by incorporating a fine particulate of metal to impart electrical conductivity. Frequently, the film is a polymeric adhesive and the metal particles provide the film with the requisite electrical property. Thermal conductivity can be obtained by adding a ceramic and/or metal and/or diamond into the adhesive.

The adhesive film can be formed from (1) a solution or paste that will polymerize to form the "polymeric" film, or (2) a polymeric substrate having an adhesive added thereto. In either case, as the quantity of filler is increased to provide the desired electrical/thermal property, the physical properties of the adhesive are degraded to a point of limited utility. For example, a typical conductive adhesive might have as much as 40–60% (v/v) filler. However, these adhesives are very weak and brittle, and are only useful when dispensed as a paste/liquid. If a film can be made from these compositions, they are difficult to handle in the "B" staged form, limiting their size and thickness.

One approach to overcome the shortcomings of filled adhesives is to limit the quantity of the filler that is added. A separate approach is to add a reinforcement like woven glass fiber. However, in both these approaches the performance of the filled adhesive is severely compromised when this is done. As a result, less than the desired amount of filler material is used. The resulting sheet adhesive can be worked, but the desired or optimal property and performance are not obtainable. Thus, existing filled adhesives sacrifice performance for usability.

In addition, particle filled sheet adhesives suffer from a phenomenon known as "particle settling" or sedimentation. The heavy particles (up to 10× the density of the resin) will sink to the bottom of the film, leaving a resin rich surface. This phenomenon results in undesirable inhomogeneities and poor reliability. High bond pressures are often required to insure that the excess surface resin is pushed back into the film. Even so, surface irregularities, could still result in resin rich areas that would be deficient in the property supplied by the particle.

Attempts at preparing film filled adhesives have been made, but significant drawbacks exist and therefore their preparation are limited. The quantity of filler that can be added is controlled by the physical limitations of: (1) polymeric film or substrate; and (2) the filler-adhesive additive. Often, the desired quantity of filler renders the adhesive-filler additive impossible to handle.

Thermosetting resins have been imbibed into substrates to impart structural integrity to an otherwise brittle layer. For example, a woven glass substrate can be imbibed with a thermosetting or thermoplastic adhesive. However, this approach has significant drawbacks when a filler is also added. For example, hollow glass microspheres have been dispersed into a thermosetting adhesive and then imbibed into a woven substrate. However, the amount of filler that can be delivered to the substrate is limited because the flexibility and manipulability of the resulting adhesive film is poor and it is difficult to conform the adhesive film for the desired applications.

Another drawback to such a composite is the limited homogeniety possible with the woven structure. At every interstices of the weave lies a composition that is different than the volume defined between the interstices. This results in inhomogenieties in physical properties, electrical properites, and in conformability. It would be desirable to have a filled adhesive sheet that is homogeneous and flexible at wide ranges of filler level.

Also, although curing additives have been added into a pressure-sensitive adhesive, and then imbibed into a polyurethane foam, the nature of the scaffolding, poses many limitations. As a result, it is very difficult to make thin composites, or flexible, thermally stable composites. Flame retardant particles have also been dispersed into an adhesive and then imbibed into a non-woven polyimide-ester substrate for use as a flame-retarded flexible circuit substrate. In general, in these prior art systems, dispersing an additive into an adhesive at an optimal level for performance sake and at the same time providing that adhesive as a thin sheet is not feasible.

Fillers have also been incorporated into fluoropolymers, such as porous expanded polytetrafluoroethylene (PTFE), by directly adding the filler to the fluoropolymer prior to extrusion and expansion. Thin porous polytetrafluoroethylene films filled with inorganic filler that are between 0.1 and 5.0 mils thick and substantially pin hole free are also known as are thin capacitive polytetrafluoroethylene layers for printed wire circuit boards (PWB). The porous polytetrafluoroethylene used can be prepared in accordance with the teachings of U.S. Pat. No. 3,953,566 to Gore. In each case, the filler is admixed with the polymer prior to extrusion and expansion.

Polytetrafluoroethylene that has not been expanded, and thus does not include the fibril-node micro-structure of expanded polytetrafluoroethylene can also include fillers. Extruded composite tapes of ceramic filler and polytetrafluoroethylene with dielectric properties have been prepared by adding the filler to the polytetrafluoroethylene prior to extrusion. Silane compounds can also be desirable for providing uniformity and improved dispersibility when aqueous polytetrafluoroethylene-filler dispersions are prepared. See U.S. Pat. Nos. 3,929,721 to Leverett and 4,038,244 to Ogden, et al. In addition to silanes, other organic compounds that render hydrophilic fillers hydrophobic, for better dispersibility, are also known. See U.S. Pat. Nos. 4,440,879 to Kawachi, et al. and 4,143,110 to Morozumi.

Composites formed in these patents require bonding at "sintering" temperatures—i.e., at very high temperatures or at high temperature and pressures. As a result, these composites have not been used to the extent contemplated, especially because of the difficulty encountered when the composites are further processed. This is particularly the case when the other materials being bonded to these composites cannot withstand these elevated temperatures and pressures.

Other attempts to avoid these drawbacks have been made, but the results have been unsatisfactory. Porous fibrillated polytetrafluoroethylene has been prepared according to the technique taught in U.S. Pat. Nos. 3,407,096 and 3,407,249 to Landi. In the Landi patents, inorganic or organic fillers are incorporated into the network of unsintered polytetrafluoroethylene fibers. The Landi process involves preparing a blend of polytetrafluoroethylene and an organic polymer that is extruded. The organic polymer is subsequently removed by dissolving in an appropriate solvent. The resulting structure precludes the introduction of particulate fillers because of the very fine fibril network.

In U.S. Pat. No. 5,141,972 to Sato, gas-containing micro balloons or spheres are used to form an insulating porous composite with polytetrafluoroethylene. In the Sato patent, the polytetrafluoroethylene substrate has a porosity of about 75% and is dipped into an ultrasonically-stirred liquid containing microballoons, allowing the spheres to flow into the pores. The imbibed substrate is heated without restraint, thus shrinking the porous polytetrafluoroethylene so as to fix the microspheres in the pores. The product produced, according to the Sato patent, is useful as a porous compressive-resistant, low dielectric. The spheres fill the pores and thus prevent the pores from being collapsed. Using the same approach, in U.S. Pat. No. 5,087,641 to Sato, porous polytetrafluoroethylene composites with sintered polytetrafluoroethylene particles within the pore volume are fabricated. In each case, the Sato composites cannot satisfactorily be imbibed with resin, and as such, would be very difficult to use as an adhesive.

Although the prior art has produced substrates that contain fillers, the addition of an adhesive to the particle being produced has not resulted in acceptable products. For example, in Japanese Laid-open-patent application 61-40328 to S. Hamasaki, et al., silicone rubber is imbibed into a porous expanded polytetrafluoroethylene structure for use as a thin electrical insulator with thickness not greater than 50 μm. The silicone rubber is imbibed as a solution and results in a product that is transparent, e.g., free of filler, that is subsequently cured. However, the structural integrity of the cured product is poor. In an attempt to reinforce the structure of the Hamasaki patent, H. Kato, et al., in Japanese Laid-open-patent 62-100539, teach a silicone rubber article which is made by first incorporating a ceramic into a dispersion of polytetrafluoroethylene. The filler is incorporated directly into the nodes of the node-and-fibril structure, and thereafter the silicone resin is imbibed into said fibrillated structure as described above. In both of these instances, the final product is a rubber-like cured sheet.

In a similar fashion, M. Hatakayama, et al., in GB-2195269B (EP-0248617B1), describes an article and process of imbibing expanded polytetrafluoroethylene with a thermosetting resin which is useful as an adhesive for printed wiring boards (PWB). An inorganic filler could be incorporated into the node-and-fibril structure of the expanded porous polytetrafluoroethylene . See also U.S. Pat. No. 4,784,901 to Hatakayama, et al. who impregnates a resin without filler into polytetrafluoroethylene.

Unfortunately, with these approaches, it is difficult to attain high degrees of ceramic loading because the ceramic serves to weaken the node and fibril structure. It is difficult to make thin films of filler-reinforced polytetrafluoroethylene because as the material thickness is reduced, the filler/fiber particulate creates pinhole tears. Furthermore, incorporating inorganic fillers, especially in the range greater than 30 volume percent, makes mixing and paste extrusion processing of these composites very difficult. An additional misfortune is that the ceramic reinforcement is not uniformly distributed throughout the composite structure.

A need exists for a uniformly reinforced, thin adhesive sheet composite that is capable of retaining high levels of reinforcement. Thus, a need exists for structurally reliable, filled-adhesive films that contain the greatest possible quantity of filler to maximize the desired property without sacrificing structural integrity. These films should: be as thin or as thick as possible, be in an easy-to-use, convenient sheet form which is not brittle, have uniform consistency and be pinhole free.

The subject invention, described below, overcomes the drawbacks of the prior art.

SUMMARY OF THE INVENTION

The present invention is directed to porous polymeric substrates that are imbibed with high quantities of filler and a thermoplastic or thermoset adhesive, as a result of the initial void volume of the polymeric substrate. In particular, fluoropolymers, such as porous expanded polytetrafluoroethylene material of U.S. Pat. Nos. 3,953,566 to Gore and 4,482,516 to Bowman, et al., each of which is incorporated herein by reference, can be used in the subject invention and are imbibed with an adhesive-filler paste mixture to provide a composite for use in the electronics industry and elsewhere.

Accordingly, it is a primary purpose of the present invention to form a composite film where a thermoset or thermoplastic adhesive resin and particulate filler, combined as a paste, are infused or imbibed into the voids of a porous polymer. The porous polymer substrate has an initial void volume of at least 30%, preferably at least 50%, and most preferably at least 70%, and facilitates the thermoset or thermoplastic adhesive resin and particulate filler paste in the voids while providing a flexible reinforcement to prevent brittleness of the overall composite and settling of the particles.

One aspect of the present invention is to provide a polymeric composite having between about 5 to about 40 volume percent polymeric substrate with 10–95 volume percent particulate filled adhesive imbibed within the voids of the substrate.

A further aspect of the present invention is to provide a process and composite whereby 5 to 85 volume percent inorganic particulate filler is contained within the composite, either in the structure of the porous polymer, or in the adhesive, or both.

It is a still further aspect of the present invention to provide a film of expanded polytetrafluoroethylene having a void volume of at least 50 percent containing an evenly distributed adhesive-filler paste mixture where the filler is 5 to 85 volume percent of the volume of the composite.

It is a further aspect of the present invention to provide a film of expanded polytetrafluoroethylene having an initial void volume of at least 30 percent and containing an adhesive-filler paste mixture where the filler is 5 to 85 volume percent of the volume of the composite and the average pore size of the polytetrafluoroethylene is not less than 2.5 times an average diameter of the particulate filler.

Alternatively, the pore size and particle size may be calculated as the smallest pore size of the PTFE being not less than 1.4 times the largest particle size.

An additional aspect of the present invention is to provide a composite having a fluoropolymer substrate with nodes interconnected by fibrils with a thermoset or thermoplastic adhesive and ceramic particles located within the voids of the fluoropolymer substrate.

It is an object of the present invention to provide an adhesive-filler containing substrate for an electronic device containing one or more layers of a composite of the subject invention having at least one layer containing a conductive metal.

These and other objects of the present invention will become evident from review of the following description. The operation of the present invention should become apparent from the following description when considered in conjunction with the accompanying non-limiting drawings.

DETAILED DESCRIPTION OF THE INVENTION

Figure 1:
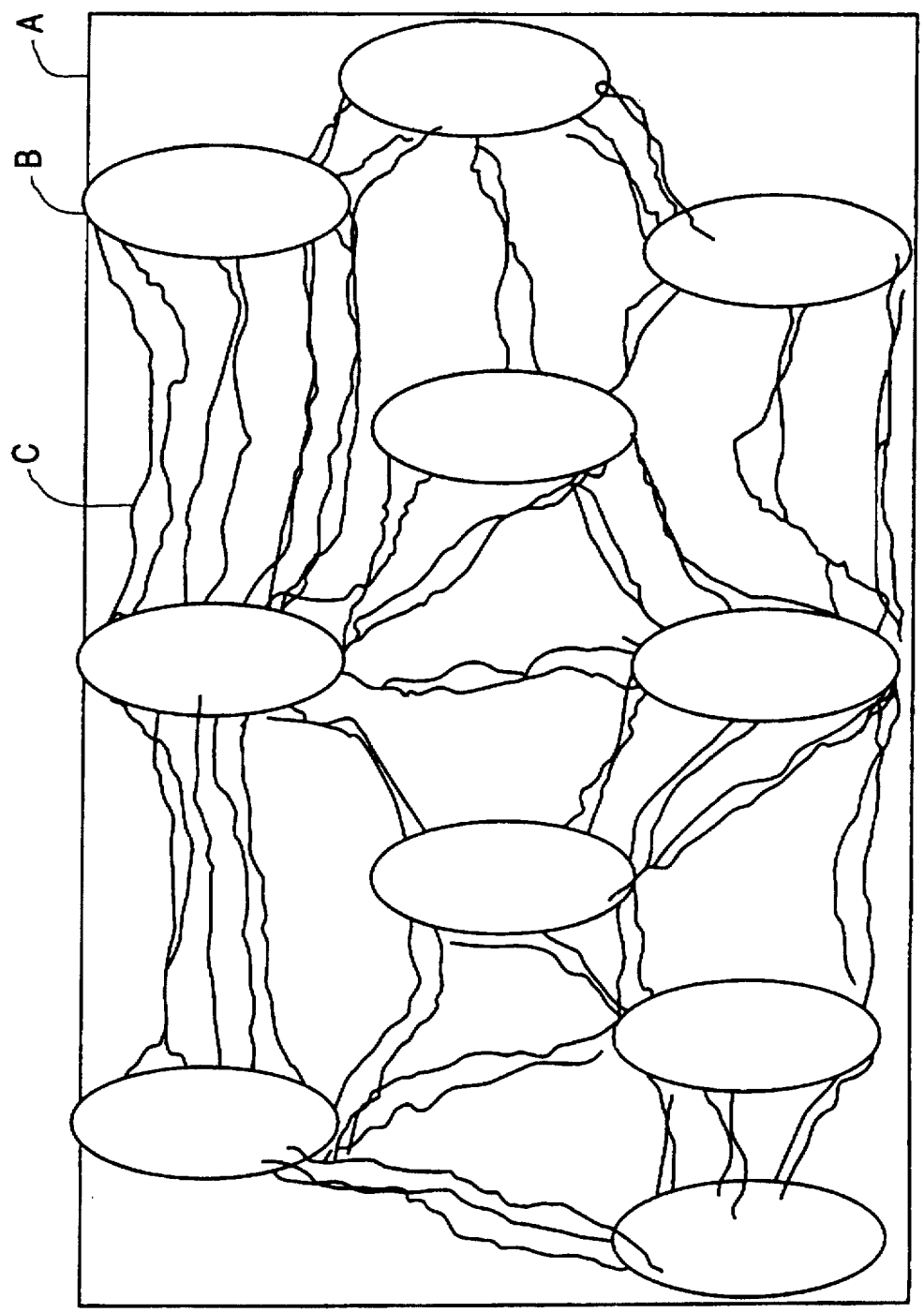
FIG. 1 illustrates an expanded or stretched polytetrafluoroethylene film (A) containing nodes (B) and interconnected with fibrils (C) without a particulate filler.

It has now been discovered that porous substrates having an initial void volume of between 30 and 95 percent, preferably at least 50 percent and often more than 70 percent, provide a scaffold substrate for imbibing adhesives containing fillers with well controlled thicknesses. Porous expanded polyolefins, such as ultra high molecular weight (UHMW) polyethylene, fluoropolymers, such as porous expanded polytetrafluoroethylene, with or without copolymers thereof, porous inorganic or organic foams, microporous cellulose acetate, etc., exemplify some of the substrates that may be used in the present invention. These materials provide a scaffold having a void volume that allows a paste of a thermoplastic or thermosetting resin with or without a filler to be imbibed into the voids of the scaffold. As a result, high loadings of inorganic fillers, e.g., ceramic fillers in particulate or fibrous form, metals in powder form, in thermosetting or thermoplastic adhesives, can be achieved by the invention described herein, while still producing a compliant, pliable convenient-to-use and easy to handle sheet adhesive free from tears or pinholes in the thin film. This result is unexpected because a typical sheet of filled adhesive is very fragile and brittle, and not handleable at all. The surprising results are due to the flexible nature of expanded substrates, such as, expanded polytetrafluoroethylene.

Traditionally, a "strong" reinforcement has been used to hold the composite together. In contrast, this invention uses a low modulus reinforcement at a much lower precentage of composition than has been achievable with strong reinforcements. This provides much higher filler percentages than formerly thought possible.

The substrate of the present invention is a scaffold formed from the minute interconnected network of nodes and fibrils that serve as the interpenetrating network within the filled adhesive. An added unexpected advantage is that the thickness of the adhesive films made with expanded polytetrafluoroethylene are tightly controlled in thickness by the membrane substrate/scaffold thickness. Thus, paste thickness control of the coating process is not the controlling parameter of the present invention which is beneficial because of the nature of the paste, e.g., its viscosity and thickness is susceptible to many variables. Instead, the thickness and structure of the starting substrate controls the imbibing process and the nature of the final product even when the scaffold makes up as little as 5% of the composite. As a result, very closely controlled thicknesses of adhesive, especially filled adhesives, can be reliably made. This is especially important for electronic and microelectronic dielectric layers.

Another unexpected benefit of the present invention is that consistent and homogeneous dispersions of particles in adhesives can be introduced into a microporous structure. This provides a number of important benefits, including: a toughening effect due to the microporosity of the substrate; and a homogeneity effect because the microporous substrate tends to keep the dispersion evenly distributed (i.e., migratia of particulate is reduced by virtue of the fact that the particulate is more or-less contained with a scaffold).

More specifically the composite compositions of this invention comprise, but are not limited to, a film of porous filled or unfilled expanded polytetrafluoroethylene that contains 5 to 40 volume percent polytetrafluoroethylene, 10–95 volume percent particulate filled adhesive imbibed within the porous structure of the polytetrafluoroethylene web. The filler may be distributed throughout the adhesive in the form of particulates suspended in the adhesive. Alternatively or in addition, the polytetrafluoroethylene may contain the same or different particulate filler in the fibril-node structure of the film to impart thermal conductivity and/or electrical conductivity. In all cases the particulate filler constitutes 5 to 85 volume percent of the total composite.

Particulate-filled adhesives are adhesives which have suspended in them one or more of the following: metals and alloys such as, but not limited to, nickel, copper, aluminum, silicon, solder, silver, gold, metal-plated particulate such as silver-plated copper, silver-placed nickel, silver-plated glass microspheres, inorganics such as $BaTiO_3$, $SrTiO_3$, $SiO_2$, $Al_2O_3$, BN, ZnO, $TiO_2$, MnO, CuO, $Sb_2O_3$, WC, fused silica, fumed silica, amorphous fused silica, sol-gel silica, sol-gel titanates, mixed titanates, ion exchange resins, lithium-containing ceramics, hollow glass microspheres, carbon-based materials such as carbon, activated charcoal, carbon black, ketchem black, diamond powder, and elastomers, such as polybutadiene, polysiloxane, and semi-metals, ceramic. Particularly preferred fillers for use with the present invention include $BaTiO_2$, $SiO_2$, $Al_2O_3$, ZnO, $TiO_2$, nickel and solder, and especially $SiO_2$, $TiO_2$ and ZnO.

The particulates provide the adhesive with one or more specific properties, such as thermal conductivity, electrical conductivity, dimensional stability, low dielectric constant, high-dielectric constant, ion-exchange capabilities, galvanic potential, flame retardency, etc. By "particulate", is meant fillers of any aspect ratio. Thus, the term includes both fillers and powders. The fillers may be treated by well-known techniques, such as silane coatings, that render the filler hydrophobic.

The adhesive itself may be a thermoset or thermoplastic and can include polyglycidyl ether, polycyanurate, polyisocyanate, bis-triazine resins, poly (bis-maleimide), norbornene-terminated polyimide, acetylene-terminated polyimide, polybutadiene and functionalized copolymers thereof, polysiloxanes, poly sisqualoxane, functionalized polyphenylene ether, polyacrylate, novolak polymers and copolymers, fluoropolymers and copolymers, melamine polymers and copolymers, poly(bis phenycyclobutane) and blends thereof. It should be understood that the aforementioned adhesives may themselves be blended together or blended with other polymers or additives, so as to impact flame retardancy or enhanced toughness.

In the present invention, expanded porous filled or unfilled substrates, includes, in addition to expanded polytetrafluoroethylene and polyolefins, non-woven papers, polymer fibers, non-woven foams that are used as the scaffold/matrix material to make the film. The non-woven papers contemplated include, but are not limited to those made via the "wet-lay" and "spun-bonded" process, e.g., cellulose paper, aramid paper. Fibrous scaffold supports can include chopped fiber mats and ceramic paper. Foams can include aerosol ceramic foams or open cell polymeric foams, or poly(ethylene terephthalate) foams. Expanded scaffold materials include expanded polyethylene, microporous polymers such as cellulose acetate and the like. These materials offer extra strength to the adhesive containing films due to the expanded form of the scaffold or matrix, and because of their low modulus. The matrix serves as a scaffold to hold together an otherwise much weaker paste/ dispersion of ceramic and adhesive.

In the present invention, the expanded polytetrafluoroethylene acts as the binder, and consequently, the adhesive must only display good glue qualities. The low modulus and intricate network of nodes and fibrils of the expanded polytetrafluoroethylene structure serves to toughen the overall composite similar to the inverted phase in a phase-separated polymer alloy. This allows for compositional ratios of components that would not ordinarily be practical because one classically relies on the adhesive as both a binder and as a glue.

Another key feature of the present invention is thickness control. Expanded polytetrafluoroethylene can be made very uniform and, once imbibed with resin, does not change its final thickness. Thus, overall thickness control is gained. Additionally, the thickness of expanded polytetrafluoroethylene can be accurately controlled and as a result, the resulting scaffold film can be made very thin or very thick. Very thin substrates have the added advantage of permitting the preparation of composites that can contain several layers.

An important aspect of the process invention lies in the use of the unusual feature of polytetrafluoroethylene to expand on stretching to form a porous material of interconnecting channels formed by nodes and fibrils. The stretching of polytetrafluoroethylene to form porous material is well known, and is described in U.S. Pat. Nos. 3,953,566 and 4,482,516. The void space in expanded polytetrafluoroethylene comprises at least 50% of the volume, and frequently more than 70%, while at the same time remaining very strong. When this void space is replaced with a filler, such as $SiO_2$, $TiO_2$, etc., it results in a very highly-filled composite that remains strong and easy to handle In the present invention, Mean Flow Pore Size and minimum pore size were determined using the Coulter® Porometer II (Coulter Electronics Ltd., Luton UK) which reports the value directly.

Average particle size and largest particle size were determined using a Microtrac light scattering particle size analyzer Model No. FRA (Microtrac Division of Leeds & Northup, North Wales, Pa., USA). The average particle size (APS) is defined as the value at which 50% of the particles are larger than. The largest particle size (LPS) is defined as the largest detectable particle on a Microtrac histogram.

Observed Density (pobs) was calculated by dividing the observed weight in grams by the calculated volume in cubic centimeters (cc). The volume of the sample was calculated by multiplying the average thickness, length and width. Each average comprised of at least 5 separate measurements. The uncertainty associated with these measurements was carried throughout the calculations.

Calculated Density (pcalc) was calculated by the following equation: $\text{pcalc} = \Sigma(vi)*(pi)$; where vi is the volume fraction of the $i^{th}$ component, and pi is the density of the $i^{th}$ component.

Prepreg Resin Content (RC) was calculated by dividing the weight of a swatch of prepreg into the weight of the same swatch after exhaustively extracting out all adhesive with solvent, allowing the swatch to dry, and weighing.

Dielectric constant (Dk) at frequencies less than 3 GHz were obtained using a Hewlett-Packard 8753A Network Analyzer (Hewlett-Packard Corp., San Jose, Calif.) by the substrate resonance method on a copper-clad laminate.

Dielectric constant (Dk) and Dissipation Factor (Df) at frequencies above 5 GHz was obtained using a resonant mode dielectrometer developed by GDK products (GDK Products, Inc., Cazoniva, N.Y.) and a Hewlett Packard 8510 Network Analyzer(Hewlett-Packard Corp., San Jose, Calif.). Copper Peel values were determined using a 90-degree peel configuration on a copper-clad laminate anchored to a rigid sliding plane substrate coupled to an Applied Test Systems Model No. 1401 computer-controlled tensile testing machine (Applied Test Systems, Inc., Butler, Pa., USA).

Compositions by weight were determined by elemental analysis by Galbraith Laboratories (Knoxville, Tenn.). $SiO_2$, $TiO_2$ and Ni composition were determined using inductively coupled plasma spectroscopy ash-fusion decomposition analysis, which was used to establish the respective amount of Si, Ti or Ni. PTFE composition was determined in a similar manner, but using fluorine by Schoniger Flask/ Specific Ion Electrode Analysis, which measured fluorine directly. The amount of adhesive was calculated by difference of mass balance.

Void volume (VV) or "volume percent air" was calculated by dividing the observed density by the calculated density and subtracting from unity, while propagating the appropriate degree of uncertainty.

Volume fraction (VF) of each component was calculated multiplying the volume of mass in the composite (1-VV) by the volume fraction of each respective component. It is calculated by the following equation: $VF_i = (1-VV)*($Volume of $i^{th}$ component/Total volume of composite$) = ([(\text{pobs})/(\text{pcalc})]*[((W_i)*(pi)](VV+\Sigma(Wi)(pi))]$; where $VF_i$ is the volume fraction of the $i^{th}$ component, pobs is the observed density in g/cc, pcalc is the calculated density in g/cc, $w_i$ is the weight fraction of the $i^{th}$ component and pi is the density of the $i^{th}$ component in g/cc.

In general, the process of the subject invention involves: (a) expanding a polytetrafluoroethylene sheet by stretching a lubricated extruded preform to a microstructure sufficient to allow small particles and adhesives to free flow into the void or pore volume; (b) forming a paste from polymeric, e.g., thermoset or thermoplastic material and a filler; and (c)

imbibing by dipping, coating, pressure feeding, the adhesive-filler paste into the highly porous scaffold, such as expanded polytetrafluoroethylene.

The following examples illustrate how the present invention may be made and used, without intending to limit the scope of the present invention.

In one of the preferred embodiments of the present invention, expanded porous filled or unfilled polytetrafluoroethylene is used as the matrix material to make the film because of its extra strength imparted by its expanded form, and because of its low modulus. The matrix serves as a scaffold to hold together and provide a void volume that is receptive to otherwise much weaker paste/dispersion ceramic and adhesive. As has been noted, due to low modulus and interconnected work of nodes and fibrils, the expanded polytetrafluoroethylene structure serves to toughen the overall composite similar to the inverted phase in a phase-separated polymer alloy. This allows for compositional ratios of components that would not ordinarily be practical because one classically relies on the adhesive as both a binder and a glue. In the present invention, the expanded polytetrafluoroethylene acts as the binder, and consequently, the adhesive must only display good glue qualities. Another key feature is the thickness control. Expanded polytetrafluoroethylene can be made very uniform, and, once imbibed with resin, does not change its final thickness. Thus, overall thickness control is gained. Additionally, expanded polytetrafluoroethylene can be made very thin or very thick. In the case of very thin films, several layers can be combined to build a composite.

An important aspect of the invention lies in the use of the unusual feature of polytetrafluoroethylene to expand on stretching to form a porous material of interconnecting channels formed by nodes and fibrils. The void space in expanded polytetrafluoroethylene comprises at least 30% of the volume, and frequently more than 50%, and more frequently more than 70% yet still remaining very strong. The void space can then be replaced by an adhesive which contains a filler that imparts a desired enhancement of properties. For example, a nickel-filled adhesive would display enhanced electrical and thermal conductivities; a fused silica-filled ($SiO_2$) adhesive would display enhanced dimensional stability and lower coefficient of thermal expansion (CTE); a lithium-filled adhesive would display enhanced ion-exchange properties; a titanium oxide ($TiO_2$) or titanate filled adhesive would display enhanced dielectric constant, and so on. The particulate themselves may have a thin coating of primer or otherwise surface-modifying layer, such as a silane coating, titanate, zirconate, sizing of the adhesive itself, if deemed necessary for mechanical integrity.

The features of the invention are now described by reference to non-limiting FIGS. 1 through 3.

In FIG. 1, film (A) contains no particulate filler, and shows expanded or stretched polytetrafluoroethylene film (A) containing nodes (B) (denoted by the irregular circles) interconnected with fibrils (C) (denoted by lines). Thus, FIG. 1 illustrates the node-and-fibril structure.

Figure 2:
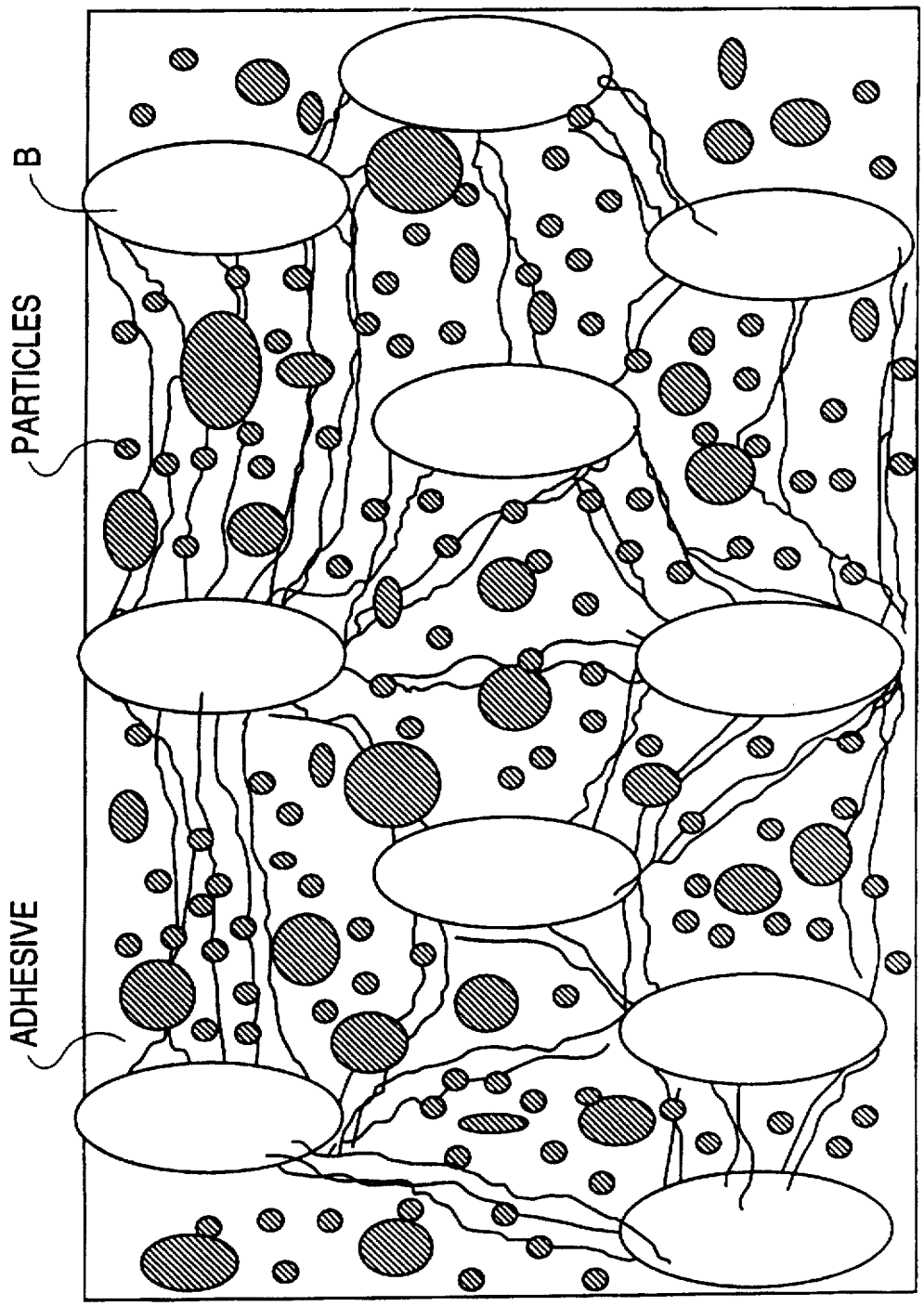
FIG. 2 illustrates an expanded or stretched polytetrafluoroethylene film where the open volume defined by said node-and-fibril structure includes a particle-filled adhesive.

In FIG. 2, the open volume defined by said node-and-fibril structure is replaced by a particle-filled adhesive. The node-and-fibril structure serves as a scaffolding for the adhesive.

Figure 3:
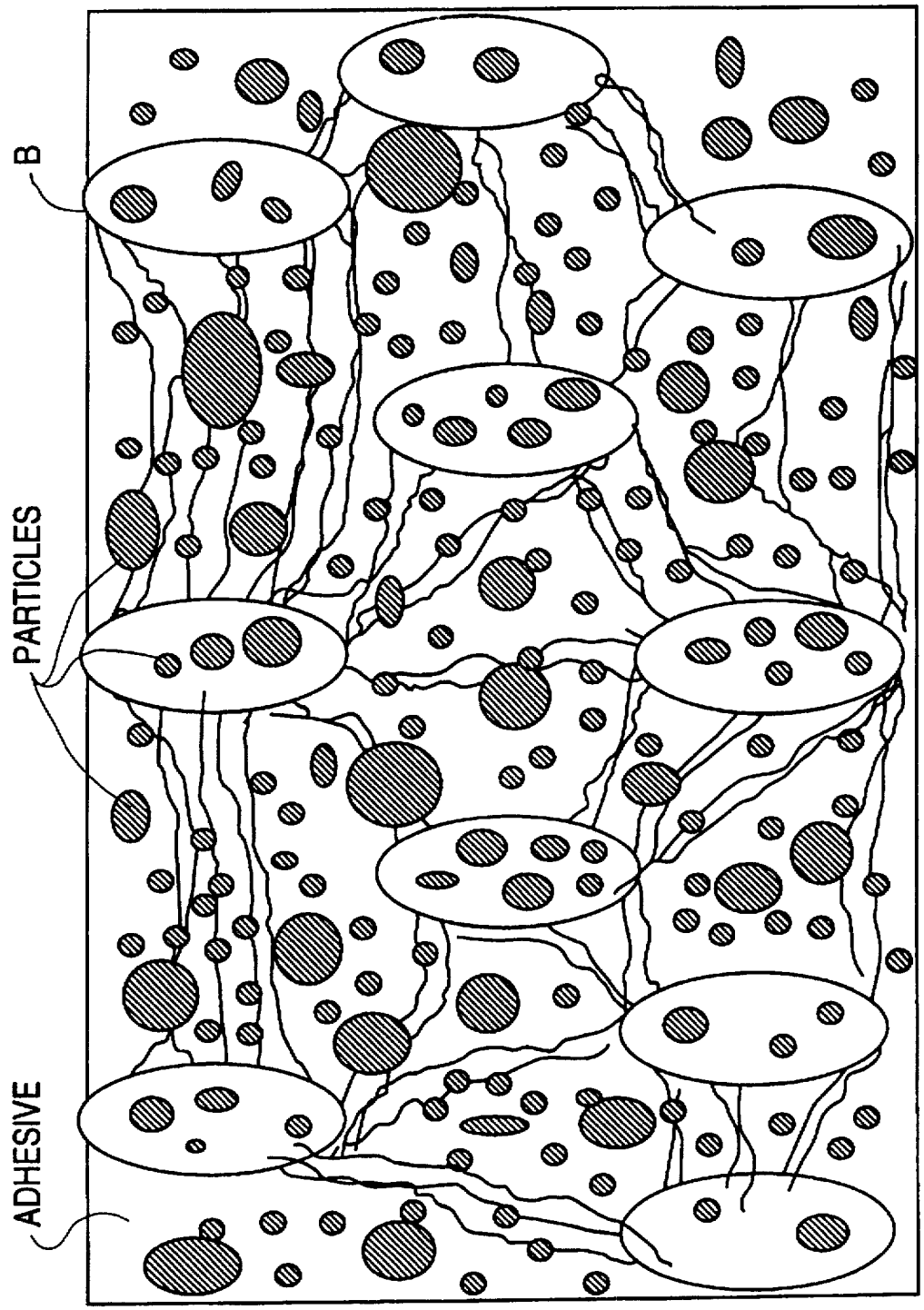
FIG. 3 illustrates an expanded or stretched polytetrafluoroethylene film where the open volume defined by said node-and-fibril structure includes a particle-filled adhesive, and filler particles are also located in the fibril-node structure.

FIG. 3 illustrates how the nodes of film (A) can also possess particles, not necessarily the same ones dispersed within the void volume.

To prepare the filled adhesive film of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate. If the substrate is to be expanded polytetrafluoroethylene, then structures similar to those taught in U.S. Pat. No. 4,482,516 to Bowman, et al. are desirable. Preferably, the mean flow pore size (MFPS) should be between about 2 to 5 times or above that of the largest particulate, with a MFPS of greater than about 2.4 times that of the filler being particularly preferred.

Alternatively, another mechanism for gauging relative pore and particle sizes may be calculated as the smallest pore size being not less than about 1.4 times the largest particle size.

Table 1 shows the effect of the relationship of the substrate mean flow pore size (MFPS) and particulate size. When the ratio of the mean flow pore size (MFPS) to largest particulate is less than 2.0, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Desc. | Substrate Pore Size | | Particle Size | | (Mean Flow Pore Size) ÷ (Avg Particle) | Min Pore ÷ Max Particle | Result |
|---|---|---|---|---|---|---|---|
| | Min (μm) | MFPS (μm) | Avg. (μm) | Max (μm) | | | |
| PP266-81a | 4 | 7 | 5 | 10 | 1.4 | 0.4 | Poor |
| PP266-81b | 4 | 5 | 5 | 10 | 1.0 | 0.4 | Poor |
| PP266-85 | — | 58 | 5 | 10 | 12.4 | — | Good |
| PP266-92 | 18 | 32 | 6 | 10 | 5.3 | 1.8 | Good |
| PP266-92 | 18 | 32 | 1 | 1 | 32.0 | 18.0 | Good |
| PP266-94 | 17 | 24 | 6 | 10 | 4.0 | 1.7 | Good |
| PP266-118 | 0.2 | 0.4 | 0.5 | 1.6 | 0.8 | 0.125 | Poor |
| PP279-74 | — | 60 | 18 | 30 | 3.3 | — | Good |
| PP279-112 | 14 | 19 | 0.5 | 1.6 | 38.0 | 8.8 | Good |
| PP289-4 | 14 | 29 | 4 | 8 | 7.3 | 1.8 | Good |
| PP289-4 | 14 | 29 | 5 | 10 | 5.8 | 1.4 | Good |

The open films are easily imbibed with particulate-filled resin. In this case, all or part of the void volume presently comprising air is replaced with particulate-filled resin/adhesive. In the case where only part of the void volume of air is replaced with resin, the final composite can be compressed in place to a very thin, void-free composite with excellent adhesion, superior thickness control, and excellent flexibility and compressibility. Thus, in this manner, one is capable of making exceptionally thin, well-controlled thicknesses of unusually highly loaded adhesives which were previously unattainable.

Figure 4:
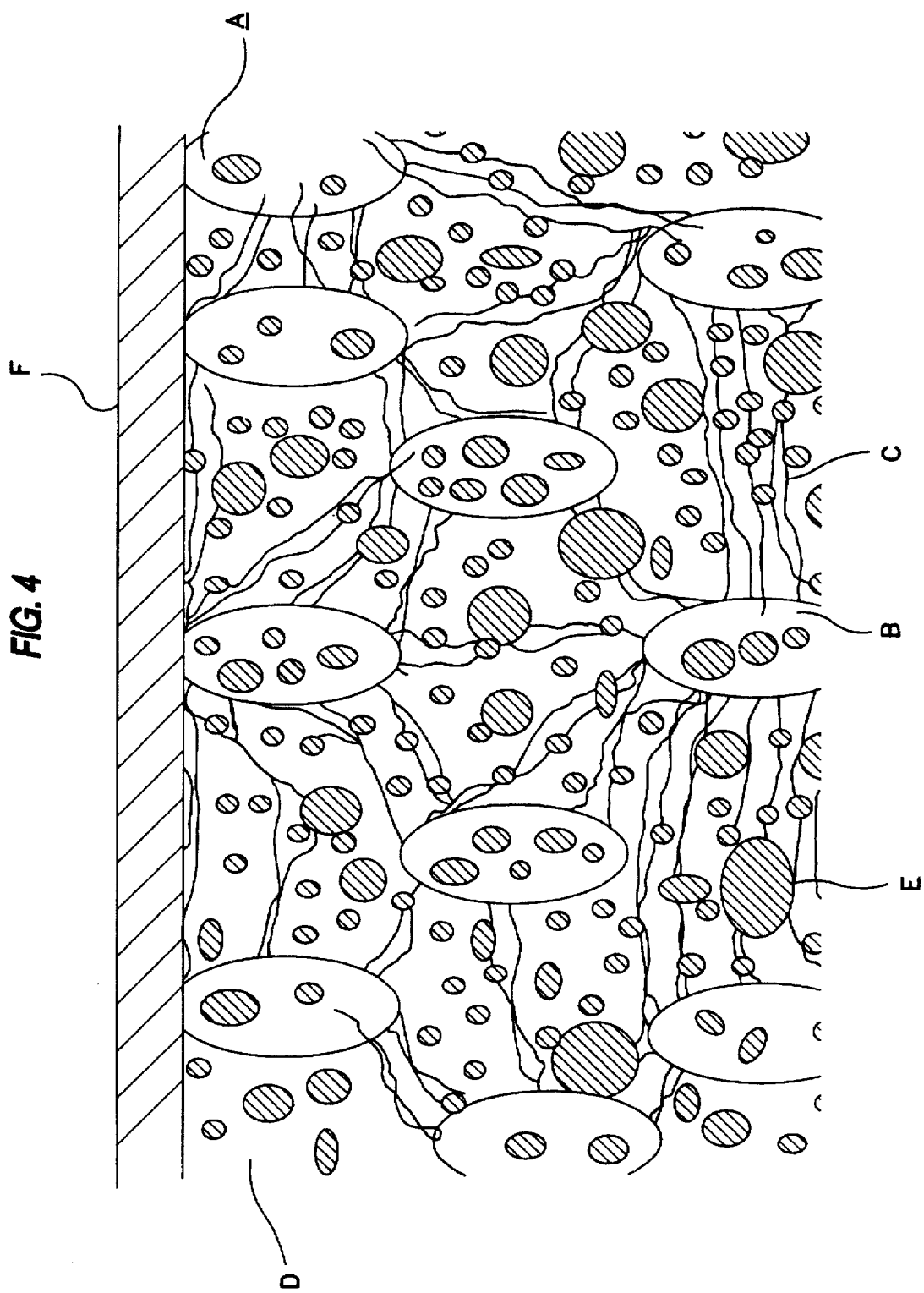
FIG. 4 illustrates a composite of the subject invention adhered to a layer of metal.

FIG. 4 illustrates composite which can be fabricated using the present invention. Adhesive film A containing nodes B interconnected with fibrils C, with adhesive D and particle E is attached to at least one layer of metal F. This construction provides a variety of applications, such as serving as a printed circuit board substrate, a buried capacitor, a thermal heat sink material, etc. A metal layer may also be applied to the opposite side of this material to produce a sandwiched construction.

EXAMPLE 1

A fine dispersion was prepared by mixing 281.6 g $TiO_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised of 57 weight percent $TiO_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 μm (0.0039"(3.9 mil)) dielectric laminate thickness.

EXAMPLE 2

A fine dispersion was prepared by mixing 44 g Ni powder (Aldrich Chemical Co., Catalog #26,698-1), 17.4 g of a platinum-cured poly(dimethylsiloxane-methylsiloxane) thermosetting silicone elastomer (Sylgard 4105, Dow Chemical Co.) and 40 g MEK. The dispersion was constantly agitated so as to insure uniformity. A swatch of expanded PTFE was then dipped into the resin mixture. Upon removing the swatch, the excess resin was wiped off the surface of both sides. The web was dried at 165° C. for 1 min. under tension to afford a flexible composite which comprised of 39 weight percent Ni, 10 weight percent PTFE, and 51 weight percent silicone and displayed an electrical conductivity of less than 100 milliohms on a 3 $in^2$ sample, and a thermal impedance of 1.33° C./W.

EXAMPLE 3

A fine dispersion was prepared by mixing 165 g ZnO powder (North American Oxide) into a 20% (w/w) solution of poly(1,2-butadiene-co-styrene) (R-104, Ricon Resins) in MEK. The dispersion was constantly agitated so as to insure uniformity. A swatch of 0.0004" of Copper-filled expanded PTFE (filled according to the teachings of U.S. patent application Ser. No. 196,048 filed Feb. 14, 1994 by Ameen, et al. to a level of 40%) was then dipped into the resin mixture. Upon removing the swatch, the excess resin was wiped off the surface of both sides. The web was dried at 165° C. for 1 min. under tension to afford a flexible composite.

EXAMPLE 4

A fine dispersion was prepared by mixing 386 g $SiO_2$ (HW-11-89, Harbison Walker Corp.) which was pretreated with phenyltrimethoxysilane (04330, Huls/Petrarch) into a manganese catalyzed solution of 200 g bismaleimide triazine resin (BT2060BJ, Mitsubishi Gas Chemical) and 388 g MEK. The dispersion was constantly agitated so as to insure uniformity. A swatch of 0.0002" expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent $SiO_2$, 5 weight percent PTFE and 42 weight percent adhesive, displayed good adhesion to copper, dielectric constant (at 10 GHz) of 3.3 and dissipation factor (at 10 GHz) of 0.005.

EXAMPLE 5

A fine dispersion was prepared by mixing 483 g SiO2 (HW-11-89, Harbison Walker Corp.) into a manganese-catalyzed solution of 274.7 g bismaleimide triazine resin (BT2060BJ, Mitsubishi Gas Chemical) and 485 g MEK. The dispersion was constantly agitated so as to insure uniformity. A swatch of 0.0002" expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent SiO2, 4 weight percent PTFE and 39 weight percent adhesive, displayed good adhesion to copper, dielectric constant (at 10 GHz) of 3.2 and dissipation factor (at 10 GHz) of 0.005.

EXAMPLE 6

A fine dispersion was prepared by mixing 15.44 kg $TiO_2$ powder (TI Pure R-900, DuPont Company) into a manganese-catalyzed solution of 3.30 kg bismaleimide triazine resin resin (BT2060BH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

While particular embodiments of the present invention have been illustrated and described herein, the present invention should not be limited to such illustrations and descriptions. It should be apparent that changes and modifications may be incorporated and embodied as part of the present invention within the scope of the following claims.

I claim:

1. A composite adhesive material comprising:

an expanded polytetrafluoroethylene film having a microstructure defined by nodes and fibrils, the film having an initial void volume and a mean flow pore size;

a mixture containing particulate filler and an adhesive, the mixture being evenly distributed throughout said void volume of said composite adhesive material, the particulate filler being a collection of individual particles, said collection containing a particle having a largest particle size which is the largest detectable particle in the collection;

wherein the ratio of mean flow pore size to the largest particle size is at least about 2.

2. The composite adhesive material according to claim 1, wherein said adhesive is a thermosetting or thermoplastic compound.

3. The composite adhesive material according to claim 2, wherein said adhesive is at least one of epoxy resin, cyanate ester resin or polybutadiene resin.

4. The composite adhesive material according to claim 1, wherein said particulate filler is at least one of $SiO_2$, $TiO_2$, or ZnO.

5. The composite adhesive material according to claim 4, wherein there are a plurality of expanded polytetrafluoroethylene films.

6. The composite adhesive material according to claim 5, wherein a metal layer is adhered to the composite adhesive material.

7. The composite adhesive material according to claim 1, wherein the composite contains 10–95 volume percent of said mixture of adhesive and filler within the voids of said expanded polytetrafluoroethvlene film.

8. The composite adhesive material according to claim 1, wherein the composite contains 5 to 85 volume percent filler material.

9. The composite adhesive material according to claim 1, wherein the expanded polytetrafluoroethylene film has an initial void volume of at least 30 volume percent.

10. The composite adhesive material of claim 1, wherein the filler and adhesive are present in amounts such that the volume of said expanded polytetrafluoroethylene film is about 5 to about 40 volume percent of said composite adhesive material.

11. The composite adhesive material of claim 1, wherein the ratio of mean flow pore size to largest particle size is at least about 2.4.

12. The composite adhesive material of claim 11, wherein the ratio of mean flow pore size to largest particle size is at least about 5.

13. The composite adhesive material of claim 1, wherein the expanded polytetrafluoroethylene film has a minimum pore size, and wherein the ratio of minimum pore size to largest particle size is about 1.4.

14. A composite adhesive material comprising:

at least one porous polymer substrate layer comprising an expanded polytetrafluoroethylene film of nodes, fibrils, and pores, the film having a minimum pore size and having an initial void volume of at least 30 volume percent percent;

said void volume containing a mixture of adhesive and particulate filler, wherein the mixture is evenly distributed throughout said void volume of said substrate layer, said mixture being present in said substrate so that the volume of the polymer substrate is about 5 to about 40 volume percent of said composite, and said filler being a collection of individual particles, said collection containing a particle having a largest particle size which is the largest detectable particle in the collection;

wherein the ratio of minimum pore size to largest particle size comprises at least about 1.4.

15. The composite adhesive material of claim 14, wherein the expanded polytetrafluoroethylene film has a mean flow pore size and wherein the ratio of mean flow pore size to largest particle size is at least about 2.

16. The composite adhesive material of claim 15, wherein the ratio of mean flow pore size to largest particle size is at least about 2.4.

17. The composite adhesive material of claim 16, wherein the ratio of mean flow pore size to largest particle size is at least about 5.

18. A composite adhesive material comprising:

a microporous film having a microstructure defined by nodes and fibrils, the film having an initial void volume and a mean flow pore size;

a mixture containing particulate filler and an adhesive, the mixture being evenly distributed throughout said void volume of said composite adhesive material, the particulate filler being a collection of individual particles, said collection containing a particle having a largest particle size which is the largest detectable particle in the collection; and wherein the ratio of mean flow pore size to the largest particle size is at least about 2.

19. A composite adhesive material comprising:

at least one porous polymer substrate layer having a microstructure defined by nodes and fibrils, the substrate layer having a minimum pore size and an initial void volume;

a mixture containing particulate filler and an adhesive, the mixture being evenly distributed throughout said void volume of said composite adhesive material, the particulate filler being a collection of individual particles, said collection containing a particle having a largest particle size which is the largest detectable particle in the collection; and wherein the ratio of minimum pore size to largest particle size comprises at least about 1.4.

* * * * *